(12) United States Patent
Shin

(10) Patent No.: US 10,903,436 B2
(45) Date of Patent: Jan. 26, 2021

(54) DISPLAY DEVICE

(71) Applicant: Samsung Display Co., Ltd., Yongin-si (KR)

(72) Inventor: Jaiku Shin, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/443,640

(22) Filed: Jun. 17, 2019

(65) Prior Publication Data
US 2020/0119290 A1    Apr. 16, 2020

(30) Foreign Application Priority Data
Oct. 15, 2018    (KR) .................. 10-2018-0122747

(51) Int. Cl.
*H05K 7/00* (2006.01)
*H01L 51/00* (2006.01)
*H01L 51/52* (2006.01)
*H01L 27/32* (2006.01)

(52) U.S. Cl.
CPC ...... *H01L 51/0097* (2013.01); *H01L 51/5237* (2013.01); *H01L 27/3244* (2013.01); *H01L 2251/5338* (2013.01)

(58) Field of Classification Search
USPC ........................................... 361/728
See application file for complete search history.

(56) References Cited

U.S. PATENT DOCUMENTS

| 10,198,038 | B2 | 2/2019 | Jang et al. | |
| 2015/0201487 | A1 | 7/2015 | Kee et al. | |
| 2017/0153668 | A1* | 6/2017 | Jang | G06F 1/1641 |
| 2017/0194411 | A1* | 7/2017 | Park | H01L 51/5262 |
| 2017/0200915 | A1 | 7/2017 | Lee et al. | |
| 2017/0373281 | A1* | 12/2017 | Park | H01L 51/5281 |
| 2018/0013080 | A1* | 1/2018 | Kim | H01L 51/0097 |
| 2018/0374399 | A1 | 12/2018 | Han | |
| 2019/0305236 | A1* | 10/2019 | Choi | H01L 27/1218 |
| 2020/0073441 | A1* | 3/2020 | Shin | H01L 51/5284 |

FOREIGN PATENT DOCUMENTS

| KR | 10-2015-0084260 A | 7/2015 |
| KR | 10-2017-0063344 A | 6/2017 |
| KR | 10-2017-0070917 A | 6/2017 |
| KR | 10-2017-0084402 A | 7/2017 |
| KR | 10-2018-0021299 A | 3/2018 |

* cited by examiner

*Primary Examiner* — Hung S. Bui
(74) *Attorney, Agent, or Firm* — Lewis Roca Rothgerber Christie LLP

(57) ABSTRACT

A display device includes: a flexible display panel; a support member below the flexible display panel and having a rigid property; a first impact absorption member below the support member and having a modulus of 0.01 Mpa to 500 Mpa; and a housing having at least a portion below the first impact absorption member and configured to accommodate the flexible display panel, the support member, and the first impact absorption member.

19 Claims, 13 Drawing Sheets

DISPLAY DEVICE

CROSS-REFERENCE TO RELATED APPLICATION

This application claims priority to and the benefit of Korean Patent Application No. 10-2018-0122747, filed on Oct. 15, 2018, the content of which in its entirety is herein incorporated by reference.

BACKGROUND

Aspects of some example embodiments of the present disclosure relate to a foldable display device.

A display device displays various images on a display screen to provide information to a user. In general, a display device displays information within an assigned screen. In recent years, flexible display devices including foldable flexible display panels have been researched. Flexible display devices may be foldable, roll-able, or bendable, as opposed to rigid display devices. A flexible display device that is capable of being variously changed in shape may be portable regardless of a size of the screen, which may improve the user's convenience.

In the case of foldable and flexible display devices, although the display device may have improved portability, when an external impact is applied to the display device, internal components may be relatively easily damaged due to a thin thickness of the display device.

The above information disclosed in this Background section is only for enhancement of understanding of the background and therefore it may contain information that does not constitute prior art.

SUMMARY

Aspects of some example embodiments of the present disclosure relate to a foldable display device, and for example, to a display device having improve durability against external impacts.

Aspects of some example embodiments of the present disclosure may include a display device having improved durability against external impacts.

According to some example embodiments of the inventive concept, a display device includes: a flexible display panel, a support member, a first impact absorption member, and a housing. The support member may be below the flexible display panel and have a rigid property. The first impact absorption member may be below the support member and have a modulus of 0.01 Mpa to 500 Mpa. The housing may have at least a portion below the first impact absorption member and accommodate the flexible display panel, the support member, and the first impact absorption member.

According to some example embodiments, the first impact absorption member may have a thickness of 50 μm to 250 μm.

According to some example embodiments, the first impact absorption member may have a Poisson's ratio of 0.1 to 0.35.

According to some example embodiments, the first impact absorption member may include a porous material.

According to some example embodiments, the support member may include a metal.

According to some example embodiments, the support member may have a thickness of 0.1 mm to 0.5 mm.

According to some example embodiments, the display device may further include an adhesion member configured to couple the support member to the first impact absorption member.

According to some example embodiments, the first impact absorption member may contact the support member.

According to some example embodiments, the display device may further include a second impact absorption member between the flexible display panel and the support member and having a modulus of 0.01 MPa to 500 Mpa.

According to some example embodiments, the display device may further include an adhesion member configured to couple the support member to the second impact absorption member.

According to some example embodiments, the flexible display panel may include a first display area, a second display area, and a folding area between the first display area and the second display area. In an embodiment, the support member may include a first support member overlapping the first display area and a second support member overlapping the second display area and spaced apart from the first support member. In an embodiment, the first impact absorption member may include: a first auxiliary impact absorption member overlapping the first support member; and a second auxiliary impact absorption member overlapping the second support member and spaced apart from the first auxiliary impact absorption member.

According to some example embodiments, the display device may further include a driving circuit configured to provide a data signal to the flexible display panel and between the support member and the housing.

According to some example embodiments of the inventive concept, a display device includes a flexible display panel, a support member, a first impact absorption member, and a housing.

According to some example embodiments the flexible display panel may include a first display area, a folding area extending from the first display area, and a second display area extending from the folding area.

According to some example embodiments the support member may be below the flexible display panel, have a rigid property, and include a first support member overlapping the first display area and a second support member spaced apart from the first support member and overlapping the second display area.

According to some example embodiments the first impact absorption member may be below the support member and include a first auxiliary impact absorption member overlapping the first support member and a second auxiliary impact absorption member spaced apart from the first auxiliary impact absorption member and overlapping the second support member.

According to some example embodiments the housing may have at least a portion below the first impact absorption member.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Hereinafter, aspects of some example embodiments of the inventive concept will be described in more detail with reference to the accompanying drawings.

In the figures, the ratio and dimensions of components may be exaggerated for clarity of illustration. The term "and/or" includes any and all combinations of one or more of the associated listed items.

The meaning of 'include' or 'comprise' specifies a property, a fixed number, a step, an operation, an element, a component or a combination thereof, but does not exclude other properties, fixed numbers, steps, operations, elements, components or combinations thereof.

Figure 1:
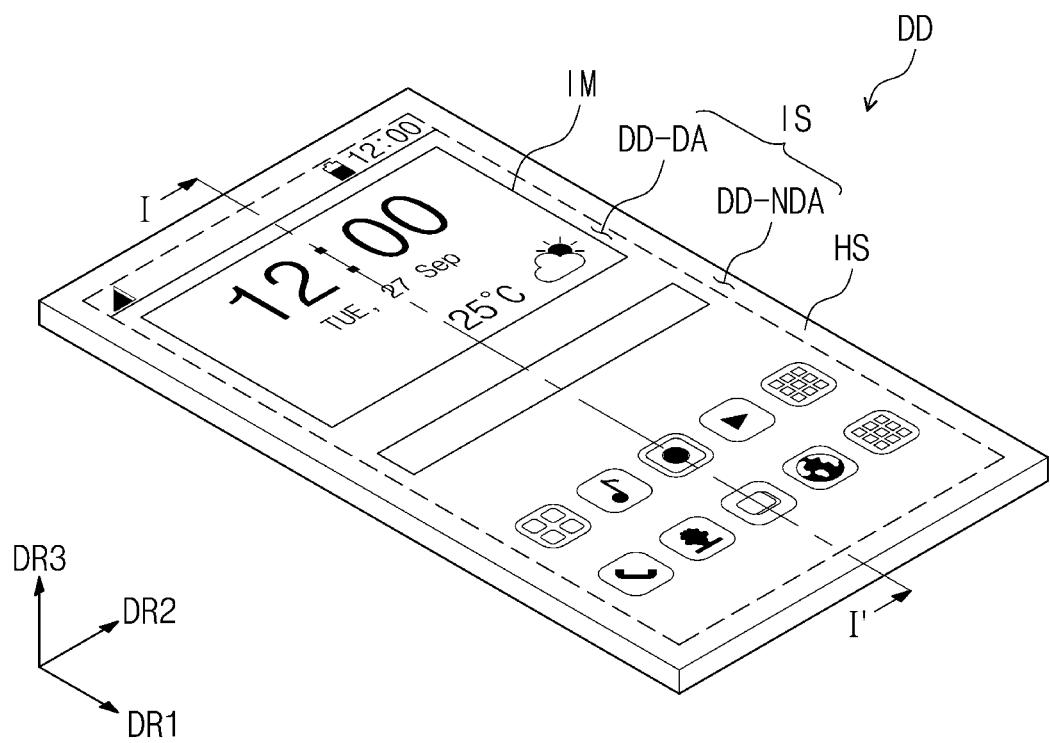
FIG. 1 is a perspective view of a display device according to some example embodiments of the inventive concept.

FIG. 1 is a perspective view of a display device DD according to some example embodiments of the inventive concept. As illustrated in FIG. 1, a display surface IS on which an image IM is displayed is parallel to a surface that is defined by a first directional axis DR1 and a second directional axis DR2. A normal direction of the display surface IS, (i.e., a thickness direction of the display apparatus DD) is indicated as a third directional axis DR3. A front surface (or top surface) and a rear surface (or bottom surface) of each of members is distinguished by the third directional axis DR3. However, directions indicated as the first to third directional axes DR1, DR2, and DR3 may be a relative concept and thus changed into different directions. Hereinafter, the first to third directions may be directions indicated by the first to third directional axes DR1, DR2, and DR3 and designated by the same reference numerals, respectively.

The display device DD according to some example embodiments of the inventive concept may be a foldable display device. The display device DD according to some example embodiments of the inventive concept may be used for large-sized electronic devices such as televisions and monitors and small and middle-sized electronic devices such as mobile phones, tablet PC, navigation units for vehicles, game consoles, and smart watches.

As illustrated in FIG. 1, the display surface IS of the display device DD may include a plurality of areas. The display device DD includes a display area DD-DA on which the image IM is displayed and a non-display area DD-NDA that is adjacent to the display area DD-DA. The non-display area DD-NDA may be an area on which an image is not displayed. FIG. 1 illustrates icons and a clock window of application as an example of the image IM. The display area DD-DA may have a rectangular shape. The non-display area DD-NDA may surround the display area DD-DA. However, the embodiment of the inventive concept is not limited thereto. For example, the display area DD-DA and the non-display area DD-NDA may be relatively designed in shape.

The display device DD may include a housing HS. The housing HS may be located outside the display device DD to accommodate components therein.

FIGS. 2A, 2B, 2C, 2D, and 2E are views illustrating an example of a state in which the display device DD of FIG. 1 is folded.

Figure 2A:
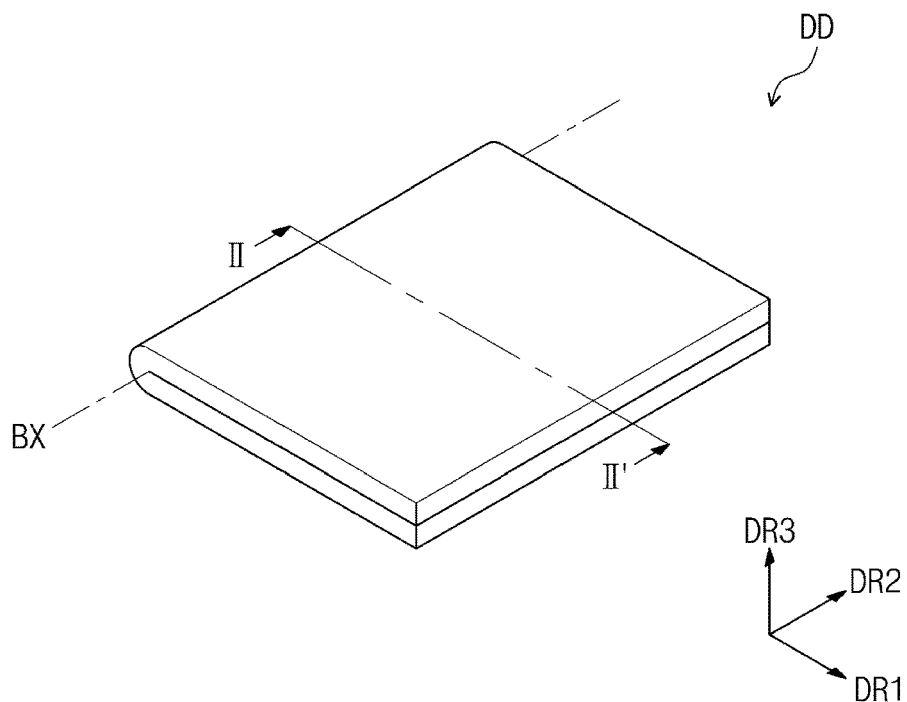
FIGS. 2A, 2B, 2C, 2D, and 2E are views illustrating a state in which the display device of FIG. 1 is folded.
Figure 2B:
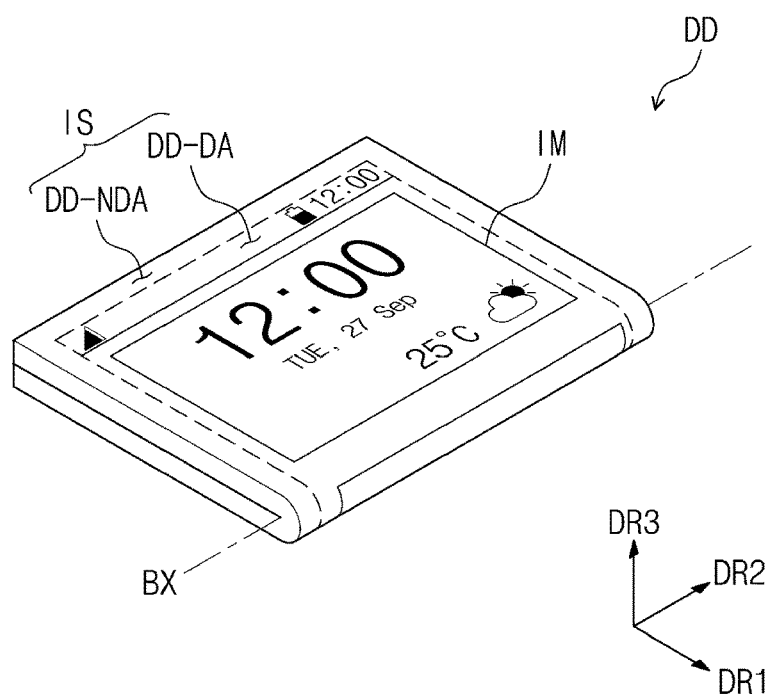
Figure 2C:
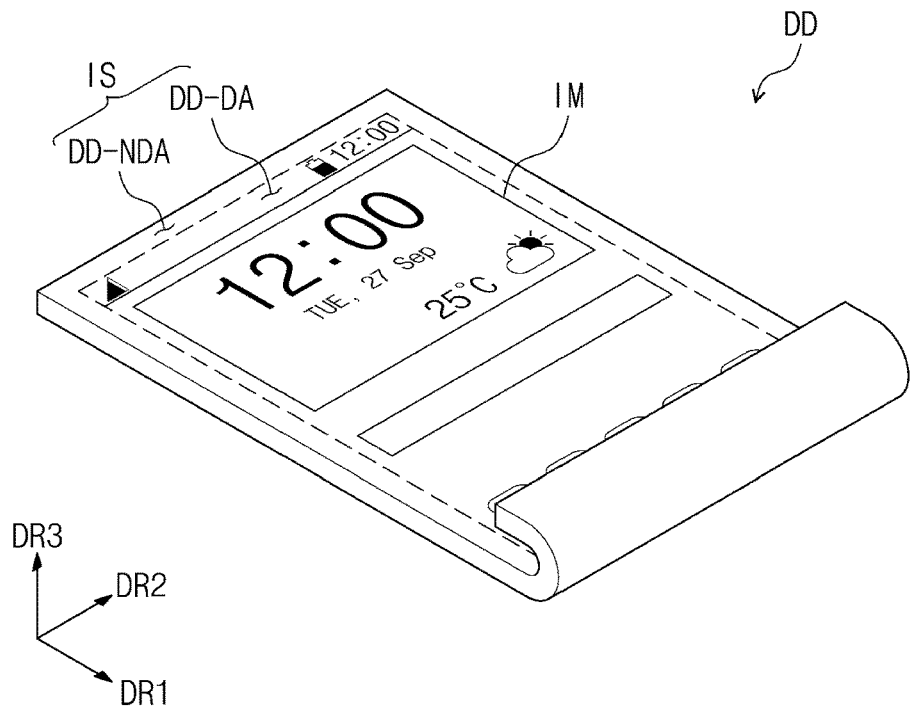
Figure 2D:
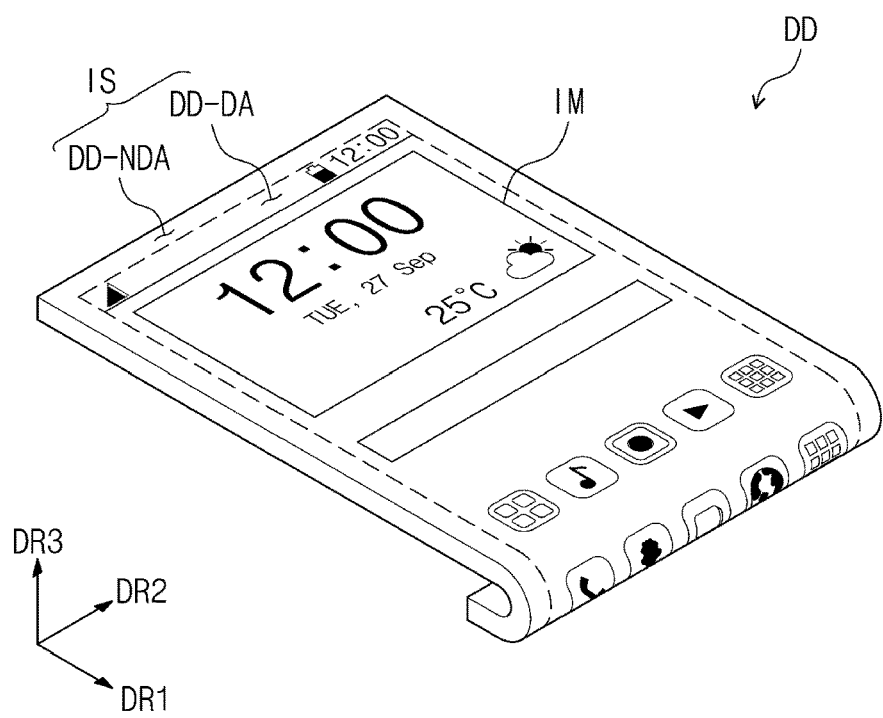
Figure 2E:
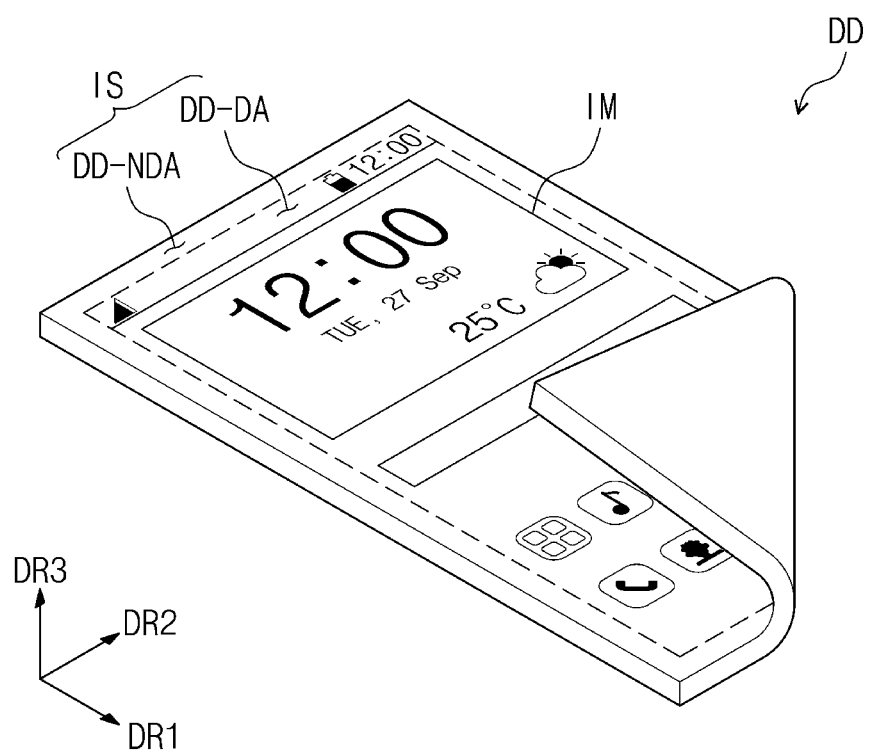

Referring to FIG. 2A, the display device DD according to some example embodiments of the inventive concept may be in-folded with respect to a bending axis BX. Referring to FIG. 2B, the display device DD according to some example embodiments of the inventive concept may be out-folded with respect to the bending axis BX. Referring to FIG. 2C, the display device DD according to some example embodiments of the inventive concept may be folded inward from an end thereof. Referring to FIG. 2D, the display device DD according to some example embodiments of the inventive concept may be folded outward from the end thereof. Referring to FIG. 2E, the display device DD according to some example embodiments of the inventive concept may be folded in a diagonal direction. FIGS. 2A to 2E are views illustrating an example of the folding method of the display device DD, but is not limited thereto.

Figure 3:
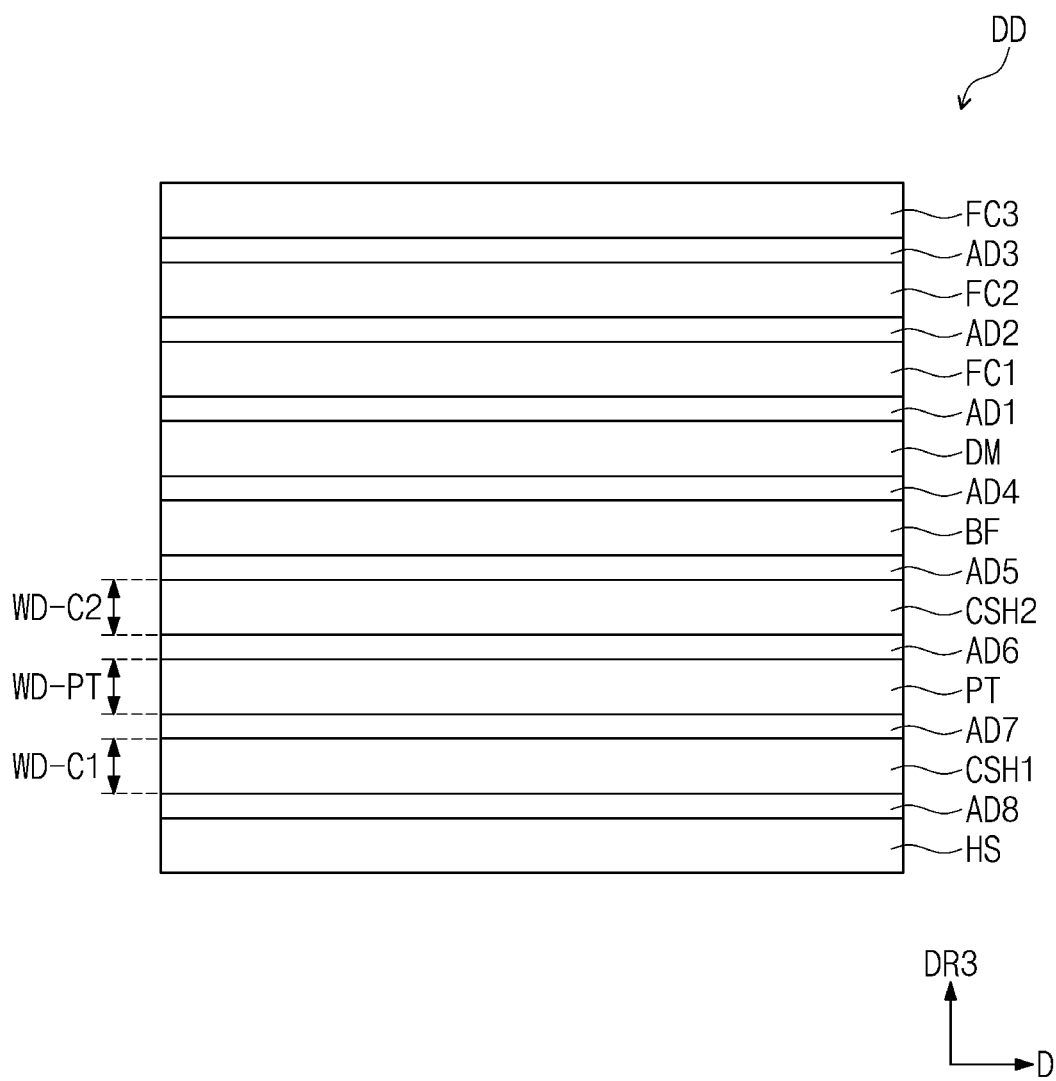
FIG. 3 is a cross-sectional view of the display device according to some example embodiments of the inventive concept.
Figure 4A:
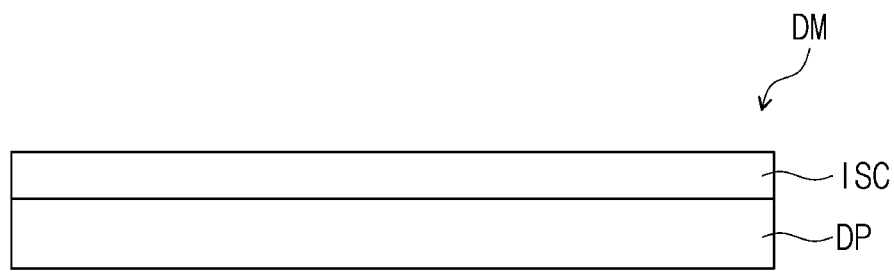
FIGS. 4A and 4B are cross-sectional views of a display module of FIG. 3.
Figure 4B:
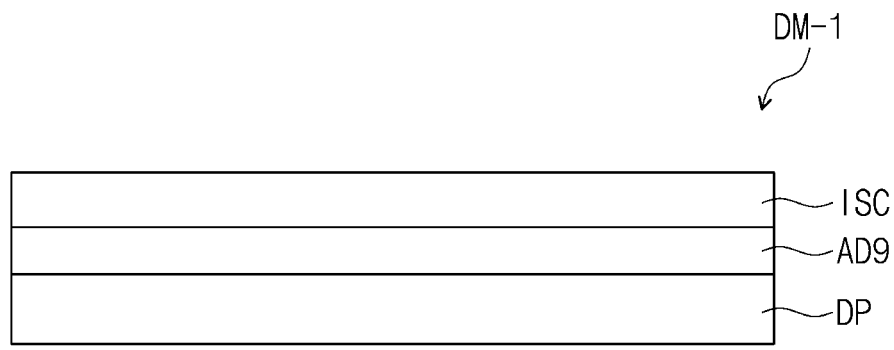

FIG. 3 is a cross-sectional view of the display device DD according to some example embodiments of the inventive concept. FIGS. 4A and 4B are cross-sectional views of display modules DM and DM-1 of FIG. 3. FIG. 3 illustrates a cross-section defined by the second directional axis DR2 and the third directional axis DR3.

The display device DD may include a display module DM, a plurality of functional layers FC1 to FC3, a base film BF, impact absorption members CSH1 and CSH2, a support member PT, a housing HS, and a plurality of adhesion members AD1 to AD8.

According to according to some example embodiments of the inventive concept, each of the adhesion members AD1 to AD8 may be a pressure sensitive adhesive (PSA).

The functional layers FC1 to FC3 may be located above the display module DM.

The first functional layer FC1 may adhere to the display module DM by a first adhesion member AD1. The second functional layer FC2 may adhere to the first functional layer FC1 by a second adhesion member AD2. The third functional layer FC3 may adhere to the second functional layer FC2 by a third adhesion member AD3.

Each of the functional layers FC1 to FC3 may include a polymer material. Each of the functional layers FC1 to FC3 may have a film shape. Each of the functional layers FC1 to FC3 may have a modulus of about 2 Gpa to about 100 Gpa.

Each of the functional layers FC1 to FC3 may have a thickness of about 35 μm to about 60 μm. When each of the functional layers FC1 to FC3 has a thickness of about 35 μm or less, performance of the originally intended function is deteriorated. When each of the functional layers FC1 to FC3 has a thickness of 60 μm or more, flexibility of the display device DD may be reduced. In an embodiment of the inventive concept, a first functional layer FC1 may be a polarizing functional layer for polarizing incident light. The second functional layer FC2 may be an impact absorption functional layer that absorbs an impact applied from the outside. The third functional layer FC3 may be a window functional layer constituting an outer surface of the display device DD. According to some example embodiments of the inventive concept, a portion of the first to third functional layers FC1 to FC3 may be omitted.

The base film BF, the impact absorption members CSH1 and CSH2, and the support member PT are located below the display module DM.

The base film BF may include a polymer material.

The impact absorption members CSH1 and CSH2 may include a first impact absorption member CSH1 and a second impact absorption member CSH2.

Each of the first impact absorption member CSH1 and the second impact absorption member CSH2 may include a polymer material. Each of the first impact absorption member CSH1 and the second impact absorption member CSH2 may be a layer for absorbing an impact applied from the outside.

According to some example embodiments of the inventive concept, each of the first impact absorption member CSH1 and the second impact absorption member CSH2 may have a modulus of about 0.01 Mpa to about 500 Mpa. When each of the first impact absorption member CSH1 and the second impact absorption member CSH2 has a modulus less than about 0.01 Mpa, the first impact absorption member CSH1 and the second impact absorption member CSH2 may be limp and thus may not well absorb the external impact. Also, when each of the first impact absorption member CSH1 and the second impact absorption member CSH2 has a modulus exceeding about 500 Mpa, the first impact absorption member CSH1 and the second impact absorption member CSH2 may be hard and thus may not well absorb the external impact.

According to some example embodiments of the inventive concept, each of a thickness WD-C1 (hereinafter, referred to as a first thickness) of the first impact absorption member CSH1 and a thickness WD-C2 (hereinafter, referred to as a second thickness) of the second impact absorption member CSH2 may be about 50 μm to about 250 μm. When each of the first thickness WD-C1 and the second thickness WD-C2 is less than about 50 μm, the possibility of damage of the impact absorption members CSH1 and CHS2 may increase while processing the absorption members CSH1 and CHS2, and the absorption members CSH1 and CHS2 may be deteriorated in impact absorption capacity. When each of the first thickness WD-C1 and the second thickness WD-C2 exceeds about 250 μm, the display device DD may be deteriorated in flexibility to cause damage of the display device DD when the display device DD is folded.

According to some example embodiments of the inventive concept, each of the first impact absorption member CSH1 and the second impact absorption member CSH2 may have a Poisson's ratio of about 0.35 or less. Each of the impact absorption members CSH1 and CSH2 may have a Poisson's ratio of about 0.1 to about 0.35.

When each of the first impact absorption member CSH1 and the second impact absorption member CSH2 has a Poisson's ratio exceed about 0.35, while an impact applied to the third direction DR3 is absorbed by the impact absorption members CSH1 and CSH2, deformation of the impact absorption members CSH1 and CSH2 in the second direction DR2 may significantly increase.

When each of the first impact absorption member CSH1 and the second impact absorption member CSH2 has a Poisson's ratio less than about 0.1, the impact absorption capacity of the impact absorption members CSH1 and CSH2 may be deteriorated.

According to some example embodiments of the inventive concept, each of the impact absorption members CSH1 and CSH2 may include a porous material. Because each of the impact absorption members CSH1 and CSH2 includes the porous material, each of the impact absorption members CSH1 and CSH2 may have a Poisson's ratio of about 0.35 or less.

According to some example embodiments of the inventive concept, each of the impact absorption members CSH1 and CSH2 may include thermoplastic polyurethane or foam rubber.

The support member PT may include a hinge that allows the display module DM to be folded or bendable. The support member PT may have a rigid property. The support member PT may include a metal.

The support member PT may have a thickness WD-PT of about 0.1 mm to about 0.5 mm. When the thickness WD-PT of the support member PT is less than about 0.1 mm, the support member PT may not have sufficient rigidity. When the thickness WD-PT of the support member PT exceeds about 0.5 mm, the total thickness of the display device DD may increase, and thus, the slim display device DD may not be provide.

The base film BF may adhere to the display module DM by a fourth adhesion member AD4.

The second impact absorption member CSH2 may adhere to the base film BF by a fifth adhesion member AD5.

The support member PT may adhere to the second impact absorption member CSH2 by a sixth adhesion member AD6.

The first impact absorption member CSH1 may adhere to the support member PT by a seventh adhesion member AD7.

The housing HS may adhere to the first impact absorption member CSH1 by an eighth adhesion member AD8. However, the embodiment of the inventive concept is not limited thereto. For example, a heat dissipation plate for releasing heat may be further located between the housing HS and the first impact absorption member CSH1.

Referring to FIG. 4A, the display module DM may include the display panel DM and an input sensing circuit ISC. The input sensing circuit ISC may sense touch and/or a pressure applied from the outside.

The input sensing circuit ISC may be directly located on an encapsulation layer of the display panel DP. Here, the direct disposition may mean that the input sensing circuit ISC is located on the display panel DP without using a separate adhesion member.

Referring to FIG. 4B, a display module DM-1 may include a display panel DP, an input sensing circuit ISC, and a ninth adhesion member AD9. The display panel DP and the input sensing circuit ISC may adhere to each other by the ninth adhesion member AD9.

Figure 5:
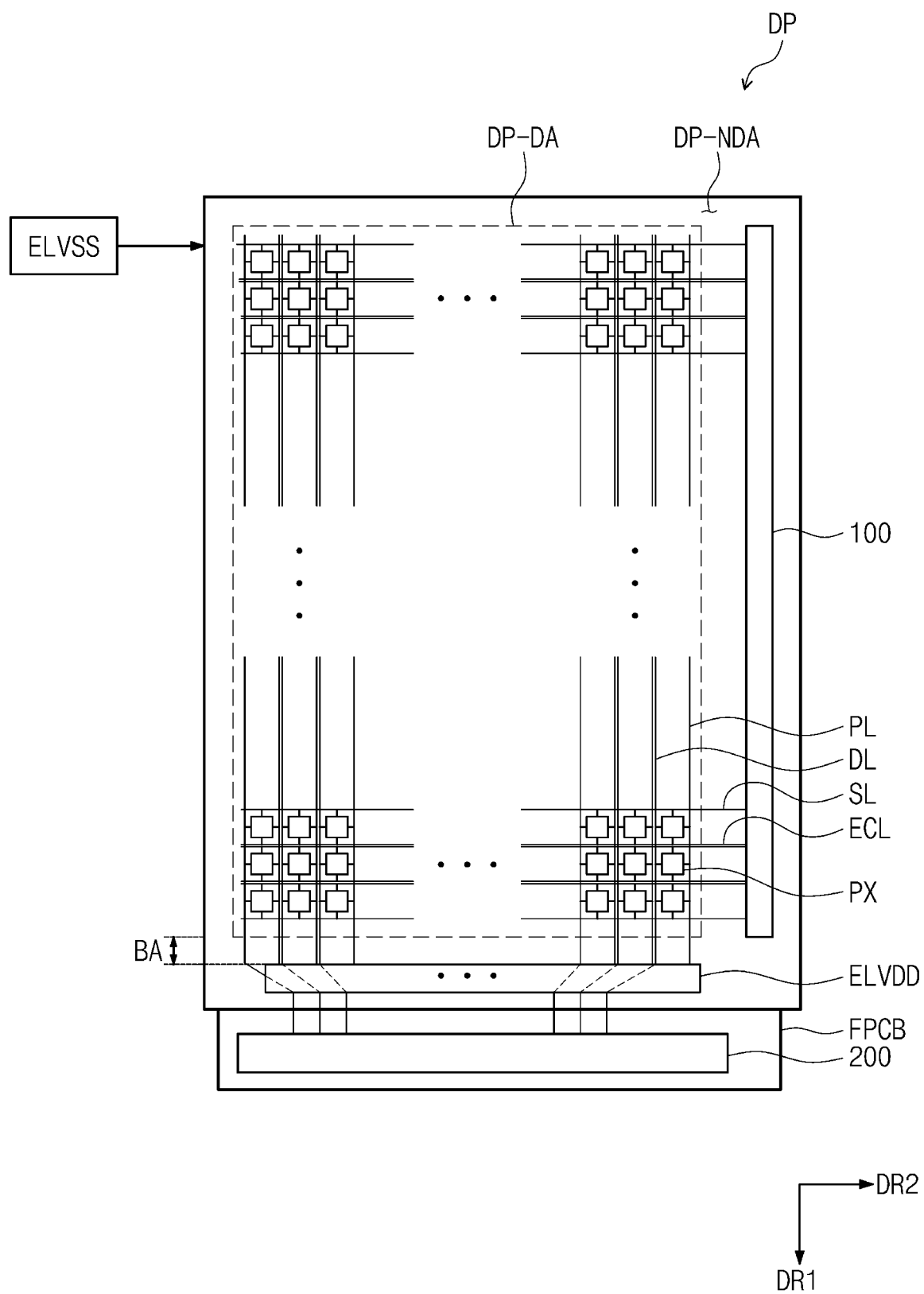
FIG. 5 is a block diagram of a display panel according to some example embodiments of the inventive concept.

FIG. 5 is a block diagram of the display panel DP according to some example embodiments of the inventive concept.

The display panel DP includes a display area DP-DA and a non-display area DP-NDA on a plane. In this embodiment, the non-display area DP-NDA may be defined along an edge of the display area DP-DA. The display area DP-DA and the non-display area DP-NDA of the display panel DP may correspond to the display area DD-DA and the non-display area DD-NDA of the display apparatus of FIG. 1, respectively.

The display panel DP may include a scan driver 100, a data driver 200, a plurality of scan lines SL, a plurality of emission control lines ECL, a plurality of data lines DL, a plurality of power lines PL, and a plurality of pixels PX (hereinafter, referred to as pixels). The pixels PX are located on the display area DP-DA. Each of the pixels PX includes an organic light emitting diode OLED (see FIG. 6) and a pixel circuit CC (see FIG. 6) connected to the organic light emitting diode OLED.

The scan driving unit 100 may include a scan driving unit and an emission control driving unit.

The scan driving unit generates scan signals to sequentially output the generated scan signals to the scan lines SL. The emission control driving unit generates emission control signals to output the generated emission control signals to the emission control lines SL.

According to some example embodiments of the inventive concept, the scan driving unit and the emission control driving unit may be provided as one circuit in the scan driving unit 100 without being divided from each other.

The scan driving unit 100 may include a plurality of thin film transistors that are manufactured through the same process as the driving circuit of the pixel PX (e.g., a low temperature polycrystalline silicon (LTPS) process or a low temperature polycrystalline oxide (LTPO) process).

The data driving unit 200 outputs data signals to the data lines DL. The data signals are analog voltages corresponding to gray level values of the image data.

According to some example embodiments of the inventive concept, the data driving unit 200 may be mounted on a printed circuit board FPCB, and the printed circuit board FPCB may be connected to pads located on one end of the data lines DL. However, embodiments of the inventive concept are not limited thereto. For example, the data driving unit 200 may be directly mounted on the display panel DP.

The scan lines SL may extend in the second direction DR2 and be arranged in the first direction DR1 crossing the second direction DR2. According to some example embodiments of the inventive concept, the second direction DR and the first direction DR1 may be perpendicular to each other, but is not limited thereto.

The emission control lines ECL may extend in the first direction DR1 and may be arranged in the second direction DR2. That is, each of the emission control lines ECL may be located in parallel to the corresponding scan line of the scan lines SL.

The data lines DL extend in the first direction DR1 and are arranged in the second direction DR2 crossing the first direction DR1. The data lines DL may provide data signals to the corresponding pixels PX.

The power lines PL extend in the first direction DR1 and are arranged in the second direction DR2. The power lines PL may provide first power ELVDD to the corresponding pixels PX.

Each of the plurality of pixels PX is connected to the corresponding scan line of the scan lines SL, the corresponding emission control line of the emission control lines ECL, the corresponding data line of the data lines DL, and the corresponding power line of the power lines PL.

The non-display area DP-NDA of the display panel DP may include a bending area BA. When the display panel DP is bent with respect to the bending area BA, the non-display area DP-NDA may decrease in area on a plane defined by the first direction DR1 and the second direction DR2 to provide the display device DD having a thin bezel. That is, in FIG. 1, the display device DD having a small area of the non-display area DD-NDA may be provided.

Figure 6:
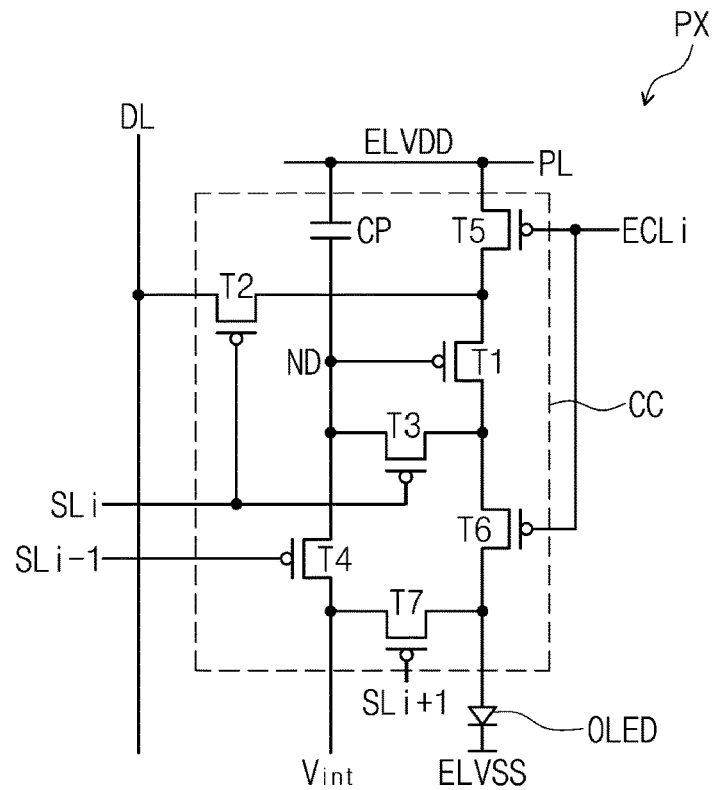
FIG. 6 is an equivalent circuit diagram of a pixel according to some example embodiments of the inventive concept.
Figure 7:
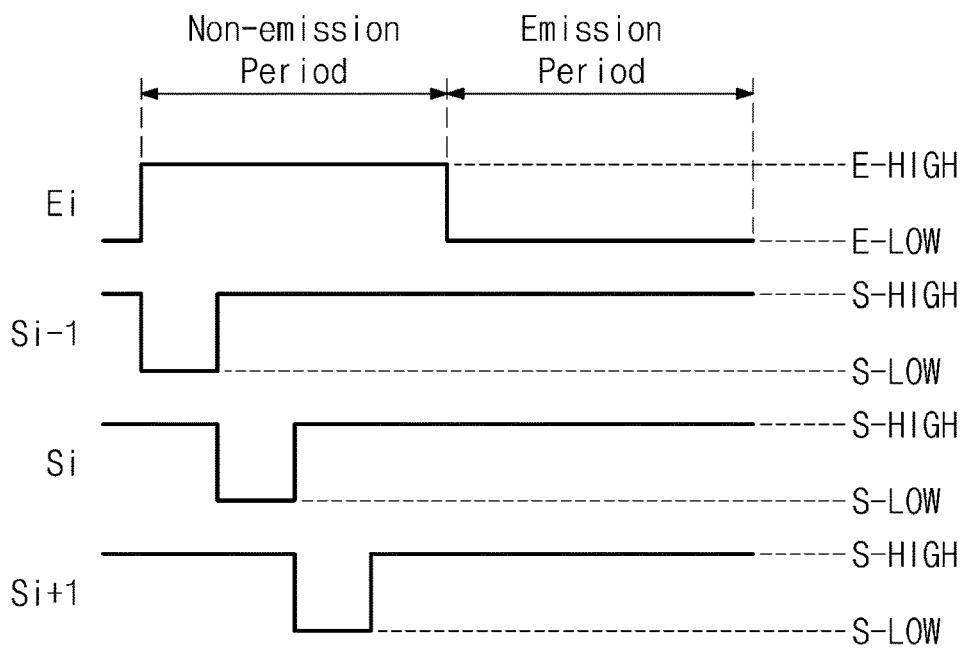
FIG. 7 is a view illustrating an example of a emission control signal and scan signals, which are applied to the pixel of FIG. 6.

FIG. 6 is an equivalent circuit diagram of the pixel PX according to some example embodiments of the inventive concept. FIG. 7 is a view illustrating an example of an emission control signal Ei and scan signals Si−1, Si, and Si+1, which are applied to the pixel PX of FIG. 6. FIG. 6 illustrates an example of the pixel PX connected to an i-th scan line SLi and an i-th emission control line ECLi.

The pixel PX may include an organic light emitting diode OLED and a pixel circuit CC. The pixel circuit CC may include a plurality of transistors T1 to T7 and a capacitor CP. The pixel circuit CC controls an amount of current flowing through the organic light emitting diode OLED in response to the data signal.

The organic light emitting diode OLED may emit light at a luminance (e.g., a predetermined luminance) corresponding to an amount of current supplied from the pixel circuit CC. For this, the first power ELVDD may be set to a level greater than that of the second power ELVSS.

Each of the transistors T1 to T7 may include an input electrode (or a source electrode), an output electrode (or a drain electrode), and a control electrode (or a gate electrode). In this specification, for convenience, either the input electrode or the output electrode may be referred to as a first electrode and the other may be referred to as a second electrode.

The first electrode of the first transistor T1 is connected to the first power ELVDD via the fifth transistor T5, and the second electrode is connected to an anode electrode of the organic light emitting diode OLED via the sixth transistor T6. The first transistor T1 may be called a driving transistor in this specification.

The first transistor T1 controls an amount of current flowing through the organic light emitting diode OLED corresponding to a voltage applied to the control electrode.

The second transistor T2 is connected between the data lien DL and the first electrode of the first transistor T1. Also, the control electrode of the second transistor T2 is connected to an i-th scan line SLi. When an i-th scan signal Si is applied to the i-th scan line SLi, the second transistor T2 may be turned on to electrically connect the data line DL to the first electrode of the first transistor T1.

The third transistor T3 is connected between the second electrode of the first transistor T1 and the control electrode. The control electrode of the third transistor T3 is connected to the i-th scan line SLi. When the i-th scan signal Si is applied to the i-th scan line SLi, the third transistor T3 may be turned on to electrically connect the second electrode of the first transistor T1 to the control electrode. Thus, when the third transistor T3 is turned on, the first transistor T1 is connected in the form of a diode.

The fourth transistor T4 is connected between a node ND and an initialization power generation unit (or initialization power generator). Also, the control electrode of the fourth transistor T4 is connected to an (i−1)-th scan line SLi−1. When an (i−1)-th scan signal Si−1 is provided to the (i−1)-th scan line SLi−1, the fourth transistor T4 is turned on to provide an initialization voltage Vint to the node ND.

The fifth transistor T5 is connected between the power line PL and the first electrode of the first transistor T1. The control electrode of the fifth transistor T5 is connected to an i-th emission control line ECLi.

The sixth transistor T6 is connected between the second electrode of the first transistor T1 and the anode electrode of the organic light emitting diode OLED. Also, the control electrode of the sixth transistor T6 is connected to the i-th emission control line ECLi.

The seventh transistor T7 is connected between the initialization power generation unit and the anode electrode of the organic light emitting diode OLED. Also, the control electrode of the seventh transistor T7 is connected to an (i+1)-th scan line SLi+1. When the (i+1)-th scan signal Si+1 is provided to the (i+1)-th scan line SLi+1, the seventh transistor T7 is turned on to provide the initialization voltage Vint to the anode electrode of the organic light emitting diode OLED.

The seventh transistor T7 may improve black display capability of the pixel PX. For example, when the seventh transistor T7 is turned on, a parasitic capacitor of the organic light emitting diode OLED may be discharged. Thus, when black luminance is implemented, the organic light emitting diode OLED does not emit light due to leakage current from the first transistor T1, and thus, the black display capability may be improved.

Additionally, although the control electrode of the seventh transistor T7 is connected to the (i+1)-th scan line SLi+1 in FIG. 6, the embodiment of the inventive concept is not limited thereto. In another embodiment of the inventive concept, the control electrode of the seventh transistor T7 may be connected to the i-th scan line SLi or the (i−1)-th scan line SLi−1.

Although a PMOS transistor is illustrated in FIG. 6, embodiments of the inventive concept are not limited thereto. In another embodiment of the inventive concept, the pixel PX may be constituted by an NMOS transistor. In some example embodiments of the inventive concept, the pixel PX may include a combination of the NMOS and the PMOS transistors.

The capacitor CP is located between the power line PL and the node ND. The capacitor CP stores a voltage corresponding to the data signal. When the fifth transistor T5 and the sixth transistor T6 are turned on according to the voltage stored in the capacitor CP, an amount of current flowing through the first transistor T1 may be determined.

Embodiments of the inventive concept, a structure of the pixel PX are not limited to the structure of FIG. 6. A pixel according to some example embodiments of the inventive concept may have various shapes to allow the organic light emitting diode OLED to emit light.

Referring to FIG. 7, an emission control signal Ei may have a high level E-HIGH and a low level E-LOW. Each of the scan signals SLi−1, SLi, and SLi+1 may have a high level S-HIGH and a low level S-LOW.

When the emission control signal Ei has th high level E-HIGH, the fifth transistor T5 and the sixth transistor T6 may be turned off. When the fifth transistor T5 is turned off, the power line PL and the first electrode of the first transistor T1 are electrically interrupted. When the sixth transistor T6 is turned off, the second electrode of the first transistor T1 and the anode electrode of the organic light emitting diode OLED are electrically interrupted. Thus, the organic light emitting diode OLED does not emit light during a period for which the emission control signal Ei having the high level E-HIGH is provided to the i-th emission control line ECLi.

Thereafter, when the (i−1)-th scan signal Si provided to the (i−1)-th scan line SLi−1 has the low level S-LOW, the fourth transistor T4 is turned off. When the fourth transistor T4 is turned on, the initialization voltage Vint is provided to the node ND.

When the i-th scan signal Si provided to the i-th scan line SLi has the low level S-LOW, the second transistor T2 and the third transistor T3 are turned on.

When the second transistor T2 is turned on, the data signal is provided to the first electrode of the first transistor T1. Here, because the node ND is initialized to the initialization voltage Vint, the first transistor T1 is turned on. When the first transistor T1 is turned on, a voltage corresponding to the data signal is provided to the node ND. Here, the capacitor CP stores a voltage corresponding to the data signal.

When the (i+1)-th scan signal Si+1 provided to the (i+1)-th scan line SLi+1 has the low level S-LOW, the seventh transistor T7 is turned on.

When the seventh transistor T7 is turned on, the initialization voltage Vint is provided to the anode electrode of the organic light emitting diode OLED to discharge the parasitic capacitance of the organic light emitting diode OLED.

When the emission control signal Ei provided to the emission control line ECLi has the low level E-LOW, the fifth transistor T5 and the sixth transistor T6 are turned on. When the fifth transistor T5 is turned on, the power ELVDD is provided to the first electrode of the first transistor T1. When the sixth transistor T6 is turned on, the second electrode of the first transistor T1 and the anode electrode of the organic light emitting diode OLED are electrically connected to each other. Thus, the organic light emitting diode OLED may generate light having a luminance (e.g., a predetermined luminance) corresponding to an amount of provided current.

Figure 8:
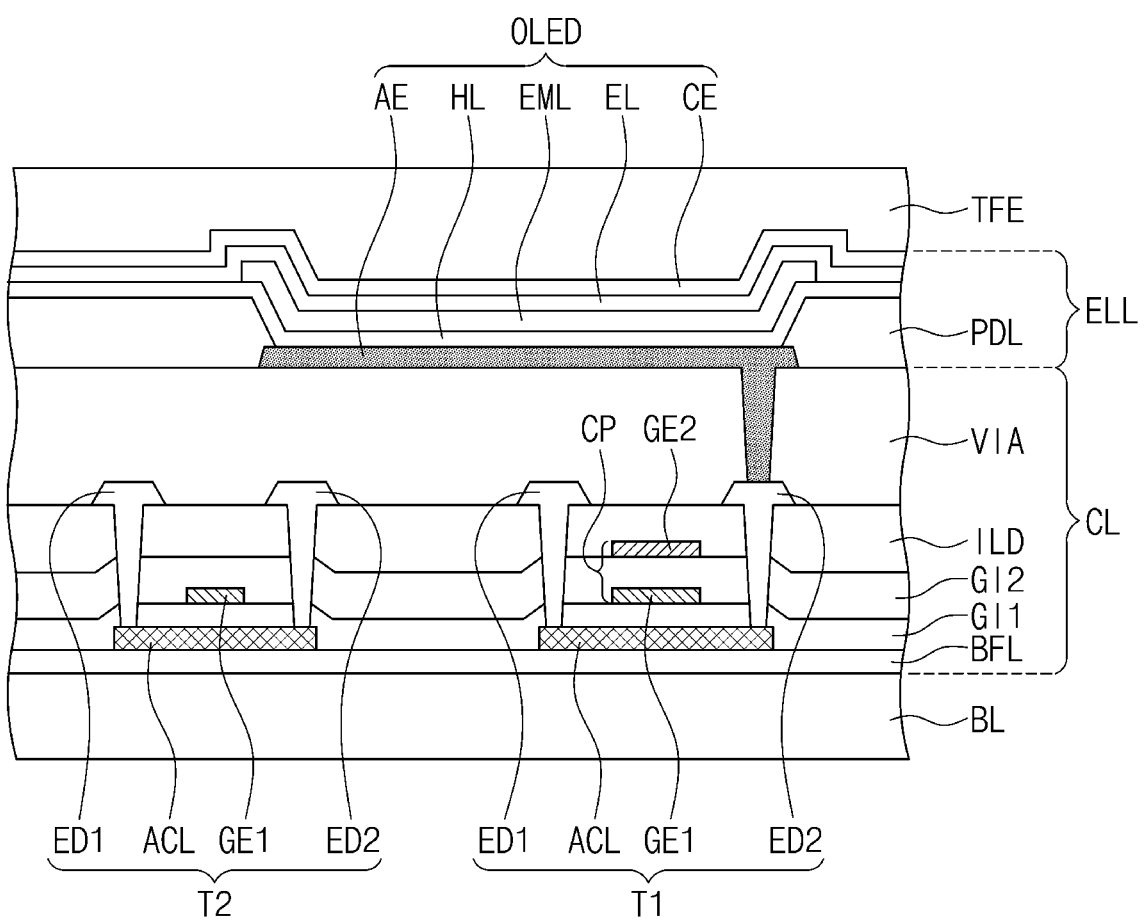
FIG. 8 is a cross-sectional view illustrating a portion of the pixel according to some example embodiments of the inventive concept.

FIG. 8 is a cross-sectional view illustrating a portion of the pixel PX (see FIG. 6) according to some example embodiments of the inventive concept. Although the first transistor T1 and the second transistor T2 are illustrated as an example in FIG. 8, a structure of each of the first and second transistors T1 and T2 is not limited thereto. Although a second electrode ED2 of the first transistor T1 directly contacts the anode electrode of the pixel PX in FIG. 8, this is merely a shape in cross-section. That is, although illustrated as described above, as illustrated in FIG. 6, the first transistor T1 may be actually connected to the anode electrode AE of the pixel PX via the sixth transistor T6. However, embodiments of the inventive concept are not limited thereto. For example, according to some example embodiments, the second electrode ED2 of the first transistor T1 may directly contact the anode electrode AE of the pixel PX.

The display panel DP (see FIG. 5) may include a base layer BL, a circuit layer CL, a light emitting element layer ELL, and an encapsulation layer TFE.

The circuit layer CL may include a buffer layer BFL, gate insulation layers GI1 and GI2, an interlayer dielectric ILD, a circuit insulation layer IVA, and transistors T1 and T2.

The light emitting element layer ELL may include an organic light emitting element OLED and a pixel defining layer PDL.

The encapsulation layer TFE may seal the light emitting element layer ELL to protect the light emitting element layer ELL against external oxygen or moisture.

The buffer layer BFL is located on one surface of the base layer BL.

The buffer layer BFL may prevent impurities existing on the base layer BL from being introduced into the pixel PX during the manufacturing process. Particularly, the buffer layer BF may prevent the impurities from being diffused into active parts ACL of the transistors T1 and T2 constituting the pixel PX.

The impurities may be introduced from the outside or generated while the base substrate BL is pyrolyzed. The impurities may be a gas or sodium discharged from the base substrate BL. Also, the buffer layer BFL may block moisture introduced from the outside into the pixel PX.

The active parts ACL constituting each of the transistors T1 and T2 are located on the buffer layer BFL. Each of the active parts ACL may include polysilicon or amorphous silicon. In addition, each of the active parts ACL may a metal oxide semiconductor.

Each of the active parts ACL may include a channel region serving as a passage through which electrons or holes move and first and second ion-doped regions located with the channel region therebetween.

A first gate insulation layer GI1 covering the active parts ACL is located on the buffer layer BFL. The first gate insulation layer GI1 includes an organic layer and/or an inorganic layer. The first gate insulation layer GI1 may include a plurality of inorganic thin films. The plurality of inorganic thin films may include a silicon nitride layer and a silicon oxide layer.

Control electrodes GE1 constituting each of the transistors T1 and T2 are located on the first gate insulation layer G11. The control electrode GE1 of the first transistor T1 may be one of two electrodes constituting the capacitor CP. At least a portion of the scan lines SL (see FIG. 5) and the emission control lines ECL (see FIG. 5) may be located on the first gate insulation layer G11.

A second gate insulation layer GI2 covering the control electrodes GE1 is located on the first gate insulation layer G11. The second gate insulation layer GI2 includes an organic layer and/or an inorganic layer. The second gate insulation layer GI2 may include a plurality of inorganic thin films. The plurality of inorganic thin films may include a silicon nitride layer and a silicon oxide layer.

The other electrode GE2 of the two electrodes constituting the capacitor CP (see FIG. 6) may be located on the second gate insulation layer GI2. That is, the control electrode GE1 located on the first gate insulation layer GI1 and the electrode GE2 located on the second gate insulation layer GI2 may overlap each other to constitute the capacitor CP of FIG. 6. However, the structure in which the electrodes constituting the capacitor CP are located is not limited thereto.

The interlayer dielectric ILD covering the electrodes GE2 is located on the second gate insulation layer GI2. The interlayer dielectric ILD includes an organic layer and/or an inorganic layer. The interlayer dielectric ILD may include a plurality of inorganic thin films. The plurality of inorganic thin films may include a silicon nitride layer and a silicon oxide layer.

At least a portion of the data line DL (see FIG. 5) and the power line PL (see FIG. 5) may be located on the interlayer dielectric ILD. First electrode ED1 and second electrodes ED2 of each of the transistors T1 and T2 may be located on the interlayer dielectric ILD.

The first electrodes ED1 and the second electrodes ED2 may be connected to the corresponding active parts ACL through through-holes passing through the gate insulation layers GI1 and GI2 and the interlayer dielectric ILD, respectively.

A circuit insulation layer VIA covering the first electrodes ED1 and the second electrodes ED2 is located on the interlayer dielectric ILD. The circuit insulation layer VIA includes an organic layer and/or an inorganic layer. The circuit insulation layer VIA may provide a flat surface.

The pixel defining layer PDL and the organic light emitting element OLED may be located on the circuit insulation layer VIA.

The organic light emitting element OLED may include an anode electrode AE, a hole control layer HL, a light emitting layer EML, an electronic control layer EL, and a cathode electrode CE.

Figure 9A:
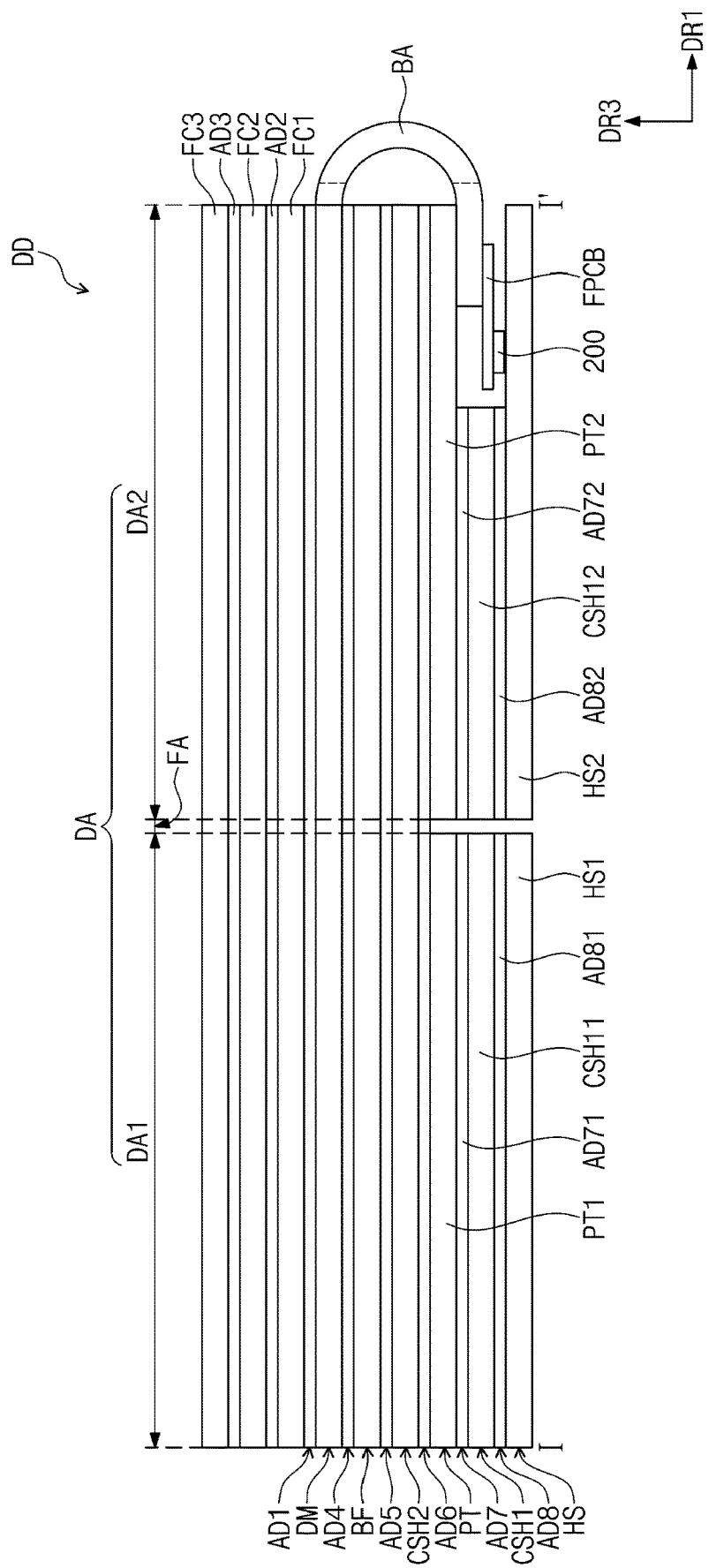
FIG. 9A is a partial cross-sectional view taken along the line I-I' of FIG. 1.
Figure 9B:
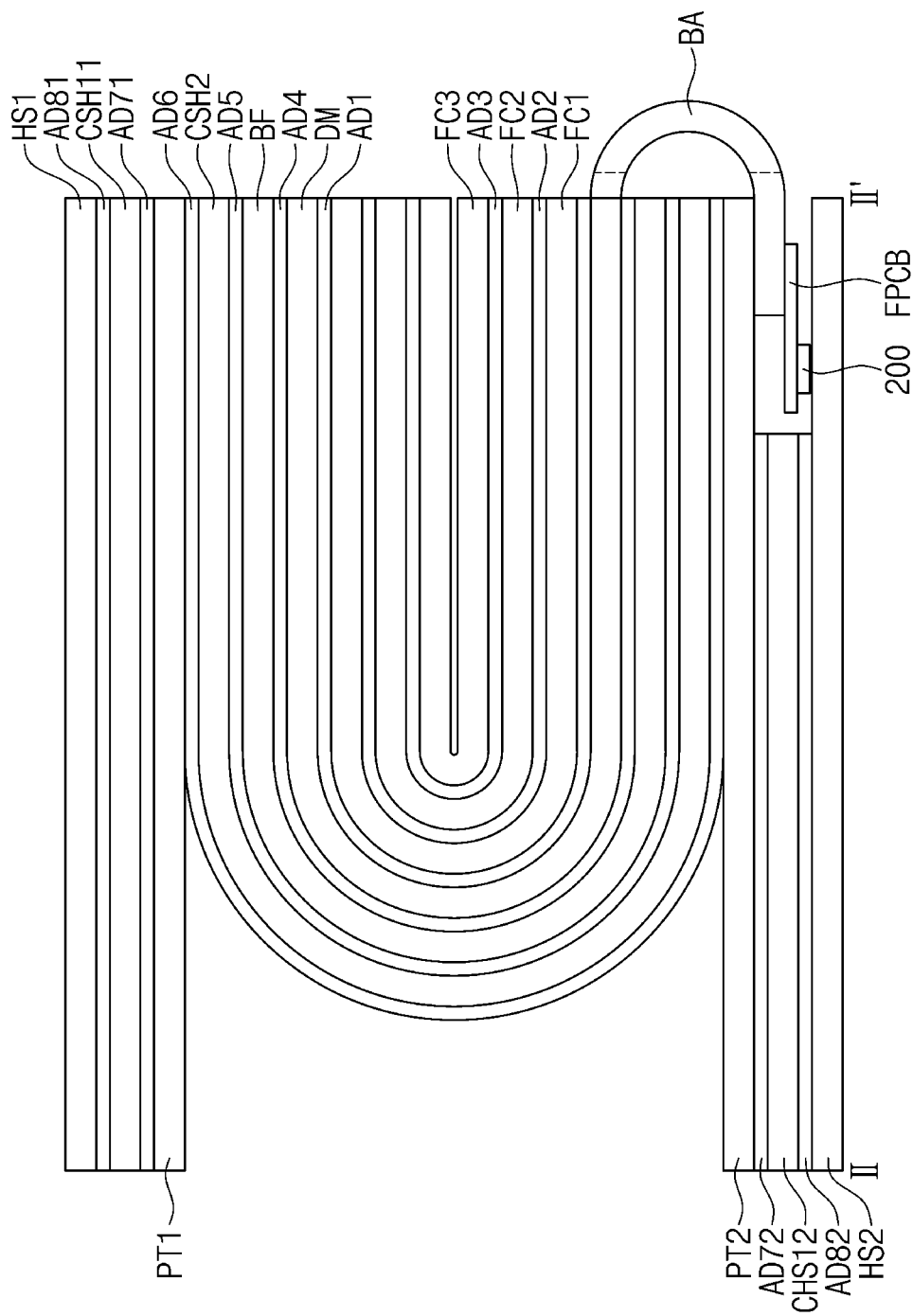
FIG. 9B is a partial cross-sectional view taken along the line II-II' of FIG. 2A.

FIG. 9A is a partial cross-sectional view taken along the line I-I' of FIG. 1. FIG. 9B is a partial cross-sectional view taken along the line II-II' of FIG. 2A. That is, FIG. 9B illustrates an example of a state in which the display device DD of FIG. 9A is folded.

The display area DA may include a first display area DA1, a folding area FA extending from the first display area DA1, and a second display area DA2 extending from the folding area FA. The folding area FA may be an area corresponding to the bending axis BX (see FIG. 2A).

The support member PT may include a first support member PT1 and a second support member PT2. The first support member PT1 overlaps the first display area DA1 in the third direction DR3, and the second support member PT2 overlaps the second display area DA2 in the third direction DR3.

The first support member PT1 may be spaced a distance (e.g., a predetermined distance) (hereinafter, referred to as a spaced distance DT) from the second support member PT2.

According to some example embodiments of the inventive concept, the bending axis BX (see FIG. 2A) may be defined by a boundary between the first support member PT1 and the second support member PT2. According to some example embodiments of the inventive concept, the bending axis BX (see FIG. 2A) may be defined as an axis overlapping the boundary between the first support member PT1 and the second support member PT2 in the third direction DR3.

The second impact absorption member CSH2 may include a first auxiliary impact absorption member CSH11 and a second auxiliary impact absorption member CSH12. The first auxiliary impact absorption member CSH11 may overlap the first support member PT1 in the third direction DR3, and the second auxiliary impact absorption member CSH12 may overlap the second support member PT2 in the third direction DR3.

The first auxiliary impact absorption member CSH11 may be located to be spaced apart from the second auxiliary impact absorption member CSH12. Thus, while the display device DD is folded, stress applied to the display device DD may be reduced.

Because the first auxiliary impact absorption member CSH11 and the second auxiliary impact absorption member CSH12 are spaced apart from each other, the seventh adhesion member AD7 may be divided into two adhesion members AD71 and AD72. Also, the eighth adhesion member AD8 may also be divided into two adhesion members AD81 and AD82.

According to some example embodiments of the inventive concept, the housing HS may include a first housing HS1 overlapping the first display area DA1 and a second housing HS2 overlapping the second display area DA2. Although not shown, a hinge for folding the display device DD may be located between the first housing HS1 and the second housing HS2.

Because the bending area BA of the display module DM is bent, at least a portion of the printed circuit board FPCB and the data driving unit 200 may be located between the support member PT and the housing HS. Also, a portion of the display module DM may also be located between the support member PT and the housing HS.

Referring to FIG. 9B, a portion of the first support member PT1 adjacent to the bending axis BX (see FIG. 2A)

and a portion of the second support member PT2 adjacent to the bending axis BX (see FIG. 2A) may not adhere to the sixth adhesion member AD6. Thus, when the display device DD is folded with respect to the bending axis BX (see FIG. 2A), limitations occurring because each of the first support member PT1 and the second support member PT2 has the rigid property may be solved.

Figure 10:
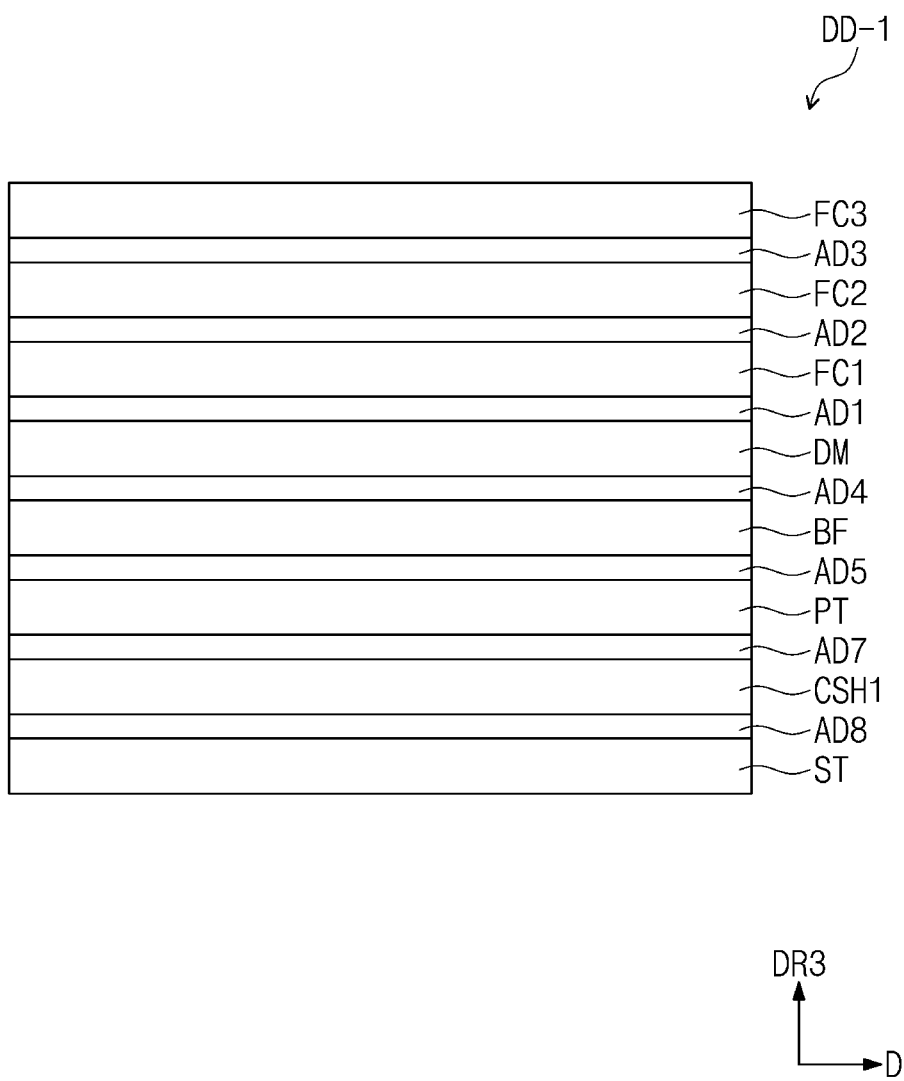
FIGS. 10 and 11 are cross-sectional views of the display device according to some example embodiments of the inventive concept.
Figure 11:
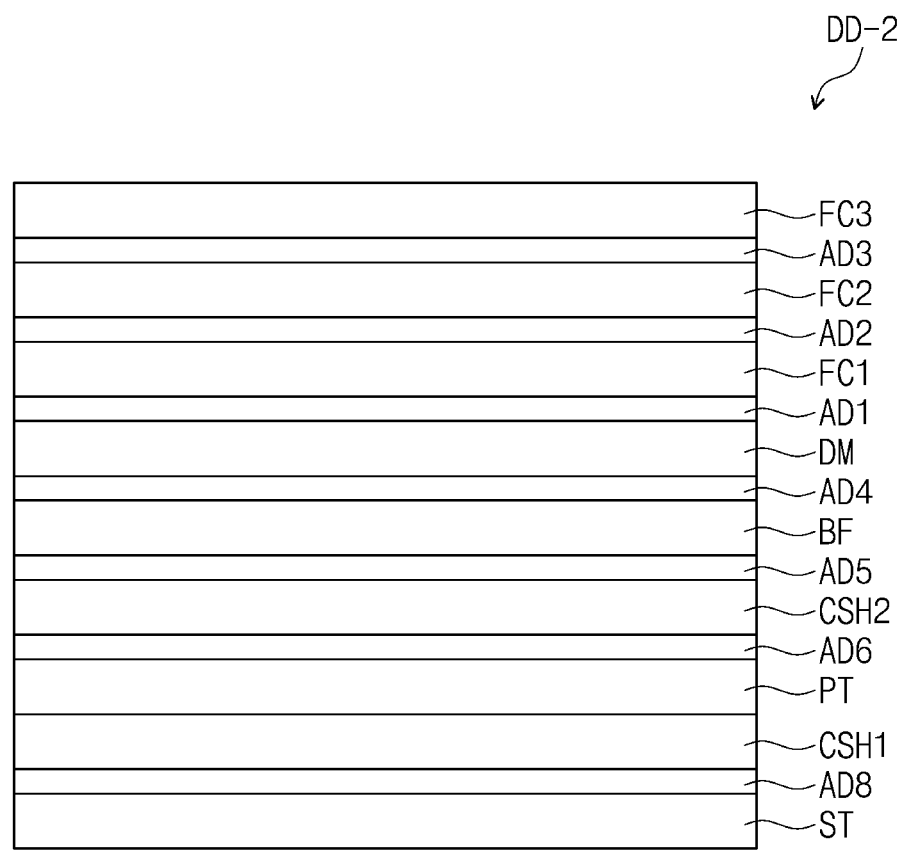
Figure 11:

FIGS. 10 and 11 are cross-sectional views of display devices DD-1 and DD-2 according to some example embodiments of the inventive concept, respectively.

The display device DD-1 of FIG. 10 is different from the display device DD of FIG. 3 in that the second impact absorption member CSH2 and the sixth adhesion member AD6 of the components of the display device DD are omitted. Thus, the support member PT may adhere to the base film BF by the fifth adhesion member AD5.

The display device DD-2 of FIG. 11 is different from the display device DD of FIG. 3 in that the seventh adhesion member AD7 of the components of the display device DD are omitted. Thus, the first impact absorption member CSH1 may contact the support member PT.

According to some example embodiments of the inventive concept, the foldable display device that is not easily damaged even though the impact is applied may be provided.

It will be apparent to those skilled in the art that various modifications and variations can be made in the inventive concept. Thus, it is intended that the present disclosure covers the modifications and variations of this invention provided they come within the scope of the appended claims and their equivalents. Thus, to the maximum extent allowed by law, the scope of the present invention is to be determined by the broadest permissible interpretation of the following claims and their equivalents, and shall not be restricted or limited by the foregoing detailed description.

What is claimed is:

1. A display device comprising:
    a flexible display panel;
    a support member below the flexible display panel and having a rigid property;
    a first impact absorption member below the support member and having a modulus of 0.01 Mpa to 500 Mpa;
    a housing having at least a portion below the first impact absorption member and configured to accommodate the flexible display panel, the support member, and the first impact absorption member; and
    a data driving unit configured to provide a data signal to the flexible display panel and disposed between the support member and the housing.

2. The display device of claim 1, wherein the first impact absorption member has a thickness of 50 µm to 250 µm.

3. The display device of claim 2, wherein the first impact absorption member has a Poisson's ratio of 0.1 to 0.35.

4. The display device of claim 3, wherein the first impact absorption member comprises a porous material.

5. The display device of claim 1, wherein the support member comprises a metal.

6. The display device of claim 5, wherein the support member has a thickness of 0.1 mm to 0.5 mm.

7. The display device of claim 1, further comprising an adhesion member configured to couple the support member to the first impact absorption member.

8. The display device of claim 1, wherein the first impact absorption member contacts the support member.

9. The display device of claim 1, further comprising a second impact absorption member between the flexible display panel and the support member and having a modulus of 0.01 MPa to 500 Mpa.

10. The display device of claim 9, further comprising an adhesion member configured to couple the support member to the second impact absorption member.

11. The display device of claim 1, wherein the flexible display panel comprises:
    a first display area;
    a second display area; and
    a folding area between the first display area and the second display area, wherein the support member comprises:
        a first support member overlapping the first display area; and
        a second support member overlapping the second display area and spaced apart from the first support member,
    wherein the first impact absorption member comprises:
        a first auxiliary impact absorption member overlapping the first support member; and
        a second auxiliary impact absorption member overlapping the second support member and spaced apart from the first auxiliary impact absorption member.

12. A display device comprising:
    a flexible display panel comprising a first display area, a folding area extending from the first display area, and a second display area extending from the folding area;
    a support member below the flexible display panel, having a rigid property, and comprising a first support member overlapping the first display area and a second support member spaced apart from the first support member and overlapping the second display area;
    a first impact absorption member below the support member and comprising a first auxiliary impact absorption member overlapping the first support member and a second auxiliary impact absorption member spaced apart from the first auxiliary impact absorption member and overlapping the second support member;
    a housing having at least a portion below the first impact absorption member; and
    a data driving unit configured to provide a data signal to the flexible display panel and disposed between the support member and the housing.

13. The display device of claim 12, wherein the first impact absorption member has a thickness of 50 µm to 250 µm.

14. The display device of claim 13, wherein the first impact absorption member has a Poisson's ratio of 0.1 to 0.35.

15. The display device of claim 14, wherein the first impact absorption member comprises a porous material.

16. The display device of claim 12, wherein the support member comprises a metal, and
    the support member has a thickness of 0.1 mm to 0.5 mm.

17. The display device of claim 12, further comprising an adhesion member configured to couple the support member to the first impact absorption member.

18. The display device of claim 12, wherein the first impact absorption member contacts the support member.

19. The display device of claim 12, further comprising a second impact absorption member between the flexible display panel and the support member and having a modulus of 0.01 MPa to 500 Mpa.

* * * * *